United States Patent
Kim et al.

(10) Patent No.: US 8,410,855 B2
(45) Date of Patent: Apr. 2, 2013

(54) METHOD AND APPARATUS FOR CONTROLLING POWER SUPPLY OF AUDIO AMPLIFIER

(75) Inventors: Han-ki Kim, Suwon-si (KR); Hae-kwang Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/815,010

(22) Filed: Jun. 14, 2010

(65) Prior Publication Data

US 2010/0321116 A1    Dec. 23, 2010

(30) Foreign Application Priority Data

Jun. 19, 2009 (KR) .................. 10-2009-0054789
Sep. 1, 2009 (KR) .................. 10-2009-0081982

(51) Int. Cl.
*H03F 3/04* (2006.01)
(52) U.S. Cl. .................. 330/297; 330/251; 330/207 A; 330/10
(58) Field of Classification Search .................. 330/297, 330/10, 251, 207 A; 381/120
See application file for complete search history.

(56) References Cited

U.S. PATENT DOCUMENTS

| 5,442,317 A | 8/1995 | Stengel |
| 7,728,666 B2* | 6/2010 | Zhang et al. .................. 330/251 |
| 2005/0110562 A1 | 5/2005 | Robinson et al. |
| 2007/0080745 A1 | 4/2007 | French et al. |
| 2008/0003959 A1 | 1/2008 | Lee et al. |
| 2008/0044041 A1* | 2/2008 | Tucker et al. .................. 381/120 |

FOREIGN PATENT DOCUMENTS

| KR | 10-0580196 B1 | 5/2006 |
| KR | 10-2006-0135254 A | 12/2006 |
| KR | 10-0765790 A | 10/2007 |

OTHER PUBLICATIONS

European Search Report, dated Jan. 25, 2011, issued in Application No. 10166216.1.
Communication dated Jun. 8, 2012 issued by the European Patent Office in counterpart European Application No. 10 166 216.1.

* cited by examiner

*Primary Examiner* — Hieu Nguyen
(74) *Attorney, Agent, or Firm* — Sughrue Mion, PLLC

(57) ABSTRACT

A method of controlling power supply voltage of an audio amplifier delays an input audio signal; estimates, with a digital signal processor, an audio output level of the delayed input audio signal based on correlations between the delayed input audio signal level and audio level change factors; sets a value of power supply voltage supplied to a power switching circuit unit in correspondence with the estimated audio output level prior to outputting the delayed input audio signal on which the estimated audio output level is based; and amplifies the delayed audio input signal to provide an audio output signal by variably controlling the power supply voltage supplied to the power switching circuit unit according to the set value of power supply voltage.

15 Claims, 10 Drawing Sheets

METHOD AND APPARATUS FOR CONTROLLING POWER SUPPLY OF AUDIO AMPLIFIER

CROSS-REFERENCE TO RELATED PATENT APPLICATION

This application claims priority from Korean Patent Application No. 10-2009-0054789, filed on Jun. 19, 2009, and Korean Patent Application No. 10-2009-0081982, filed on Sep. 1, 2009, in the Korean Intellectual Property Office, the disclosures of both of which are incorporated herein in their entirety by reference.

BACKGROUND OF THE INVENTION

1. Field of the Invention

Apparatuses and methods consistent with the present invention relate to a digital audio amplifier system, and more particularly, to a method and apparatus for controlling a power supply of an audio amplifier by changing the power supply voltage supplied to a power switching circuit unit of the audio amplifier.

2. Description of the Related Art

In general, digital audio systems use audio amplifiers, which are classified into class-A, class-B, class-AB, and class-D audio amplifiers. Class-D audio amplifiers may prevent amplification efficiency reduction caused in class-A, class-B, and class-AB audio amplifiers.

Class-D audio amplifiers are classified as open loop type or closed-loop type, and change an audio signal into a pulse width modulation (PWM) signal.

A class-D audio amplifier generally drives a power switching circuit by using a high fixed power value corresponding to a maximum audio output. The class-D audio amplifier that operates at high power may cause device heating or generate noise in neighboring electronic devices.

Accordingly, a technology for appropriately controlling power supply voltage of an audio amplifier is needed.

SUMMARY OF THE INVENTION

The present invention provides a method and apparatus for variably controlling power supply voltage of an audio amplifier according to an input audio signal level.

According to an aspect of the exemplary embodiments, there is provided a method of controlling power supply voltage of an audio amplifier, the method including estimating, with a digital signal processor, an audio output level of an input audio signal based on correlations between the input audio signal level and audio level change factors; setting a value of power supply voltage supplied to a power switching circuit unit in correspondence with the estimated audio output level; and amplifying an audio output signal by variably controlling the power supply voltage supplied to the power switching circuit unit according to the set value of power supply voltage.

According to another aspect of the exemplary embodiments, there is provided an apparatus for controlling power supply of an audio amplifier, the apparatus including a digital signal processor which estimates an audio output level based on correlations between an input audio signal level and audio level change factors, and sets a power control value corresponding to the estimated audio output level; a variable power supply unit which supplies a voltage that is variable according to the power control value set by the digital signal processor; and a power switching circuit unit for which amplifies a pulse width modulation signal according to variable voltage supplied by the variable power supply unit.

The digital signal processor may include a signal level detection unit which detects audio signal levels of a plurality of channels; an output change factor analysis unit which analyzes audio level change factors regarding an audio output by using a volume level value and gain values of the audio amplifier; an audio output estimation unit which estimates an audio output level based on correlations between the audio signal level detected by the signal level detection unit and the audio level change factors analyzed by the output change factor analysis unit; and a power control value generation unit which sets a power control value corresponding to the audio output level estimated by the audio output estimation unit.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF THE EXEMPLARY EMBODIMENTS

Figure 1A:
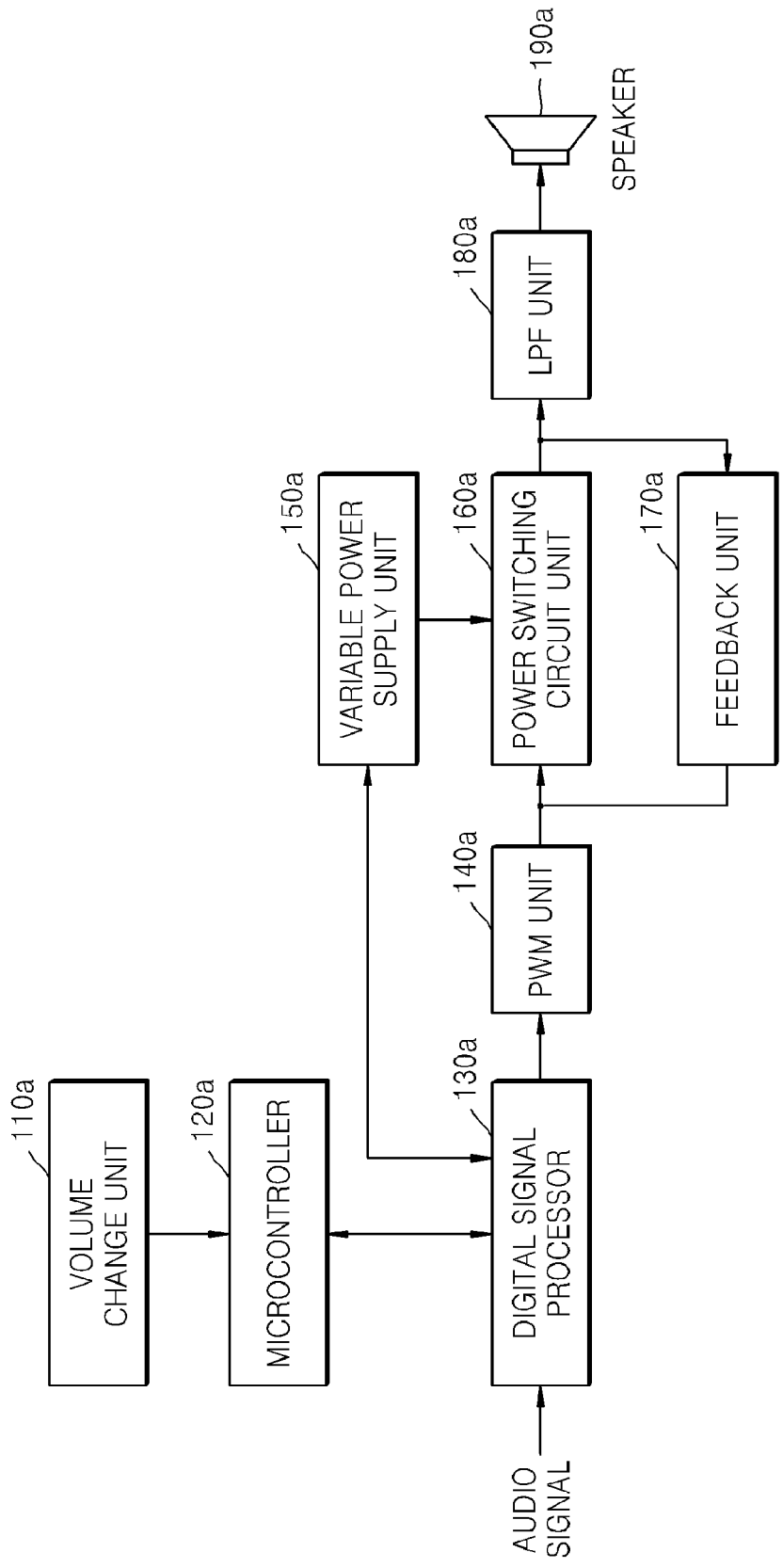
FIG. 1A is a block diagram of a closed-loop type class-D audio amplifier system according to an exemplary embodiment of the present invention.

Hereinafter, the present invention will be described in detail by explaining exemplary embodiments of the present invention with reference to the attached drawings. The present invention may be embodied in various forms without being limited to the embodiments set forth herein. Descriptions of well-known parts are omitted for clarity, and like reference numerals refer to like elements throughout.

FIG. 1A is a block diagram of a closed-loop type class-D audio amplifier system according to an exemplary embodiment of the present invention.

Referring to FIG. 1A, when power supply voltage is changed, the closed-loop type class-D audio amplifier system simultaneously changes the duty and the amplitude of a pulse width modulation (PWM) signal supplied by the PWM unit 140a. Thus, an audio output of the closed-loop type class-D audio amplifier system is not affected by a power supply voltage change.

The closed-loop type class-D audio amplifier system includes a volume change unit 110a, a microcontroller 120a, a digital signal processor 130a, a PWM unit 140a, a variable power supply unit 150a, a power switching circuit unit 160a, a feedback unit 170a, a low pass filter (LPF) unit 180a, and a speaker 190a.

An analog or digital audio signal having a plurality of channels is input to the closed-loop type class-D audio amplifier system.

The volume change unit 110a may be part of a remote controller or a display panel and generates volume key information according to a volume key selected by a user.

When the volume key information is received by the microcontroller 120a, the microcontroller 120a converts the volume key information into a volume level value. Also, the microcontroller 120a loads internal gain values of the closed-loop type class-D audio amplifier system, which affect an audio output. For example, the internal gain values may include, but are not limited to, gain values of the digital signal processor 130a and the PWM unit 140a. The microcontroller 120a initially sets the gain values of the digital signal processor 130a and the PWM unit 140a according to the number of channels of the input audio signal, and, when a reproduction operation is performed, transmits the gain values to the digital signal processor 130a and the PWM unit 140a.

The digital signal processor 130a converts the input audio signal into pulse code modulated (PCM) audio data according to a control signal of the microcontroller 120a.

Then, the digital signal processor 130a analyzes audio level change factors that affect an audio output, for example, but not limited to, the volume level value and the internal gain values of the closed-loop type class-D audio amplifier system, which are input from the microcontroller 120a. The digital signal processor 130a also estimates an audio output level based on correlations between the input audio signal level and the audio level change factors, and sets the power supply voltage supplied to the power switching circuit unit 160a in correspondence with the estimated audio output level. Then, the digital signal processor 130a outputs a power control signal corresponding to the estimated audio output level, to the variable power supply unit 150a. The power control signal causes the variable power supply unit 150a to adjust the power supply voltage supplied to the power switching circuit unit 160a prior to output of the audio signal on which the estimated audio output level is based.

In this case, the digital signal processor 130a may process the power control signal to be transmitted to the variable power supply unit 150a, by using a stepped method or a linear method.

In the stepped method, the digital signal processor 130a transmits a power control signal that matches a reference value of each step, to the variable power supply unit 150a. In the linear method, the digital signal processor 130a transmits a linear value that is proportional to the level of an audio signal output without a reference value of each step, to the variable power supply unit 150a.

Also, the digital signal processor 130a adjusts a tracking time of the power control signal with respect to the output audio signal so as to prevent sound quality distortion due to output audio signal clipping caused by insufficient power supply voltage.

The PWM unit 140a compares the level of a carrier signal to the level of the PCM audio data output from the digital signal processor 130a and generates a low-power PWM signal.

The variable power supply unit 150a supplies a variable voltage corresponding to a power control value input from the digital signal processor 130a, to the power switching circuit unit 160a. According to an exemplary embodiment of the present invention, the variable power supply unit 150a may be realized by using a resistance ratio.

The power switching circuit unit 160a power-amplifies the low-power PWM signal generated by the PWM unit 140a into a high-power PWM signal according to the variable voltage supplied from the variable power supply unit 150a. According to an exemplary embodiment of the present invention, the power switching circuit unit 160a amplifies a low-power PWM signal of 3.3V into a high-power PWM signal of 5V to 40V. One of ordinary skill in the art will appreciate that other voltage levels are possible.

The feedback unit 170a feeds a portion of the high-power PWM signal output from the power switching circuit unit 160a back to the power switching circuit unit 160a in order to correct an error between input and output signals of the power switching circuit unit 160a.

The LPF 180a removes noise and restores an original audio signal by low-pass-filtering the high-power PWM signal power-amplified by the power switching circuit unit 160a.

The speaker 190a reproduces the audio signal outputted by the LPF 180a as sound.

Figure 1B:
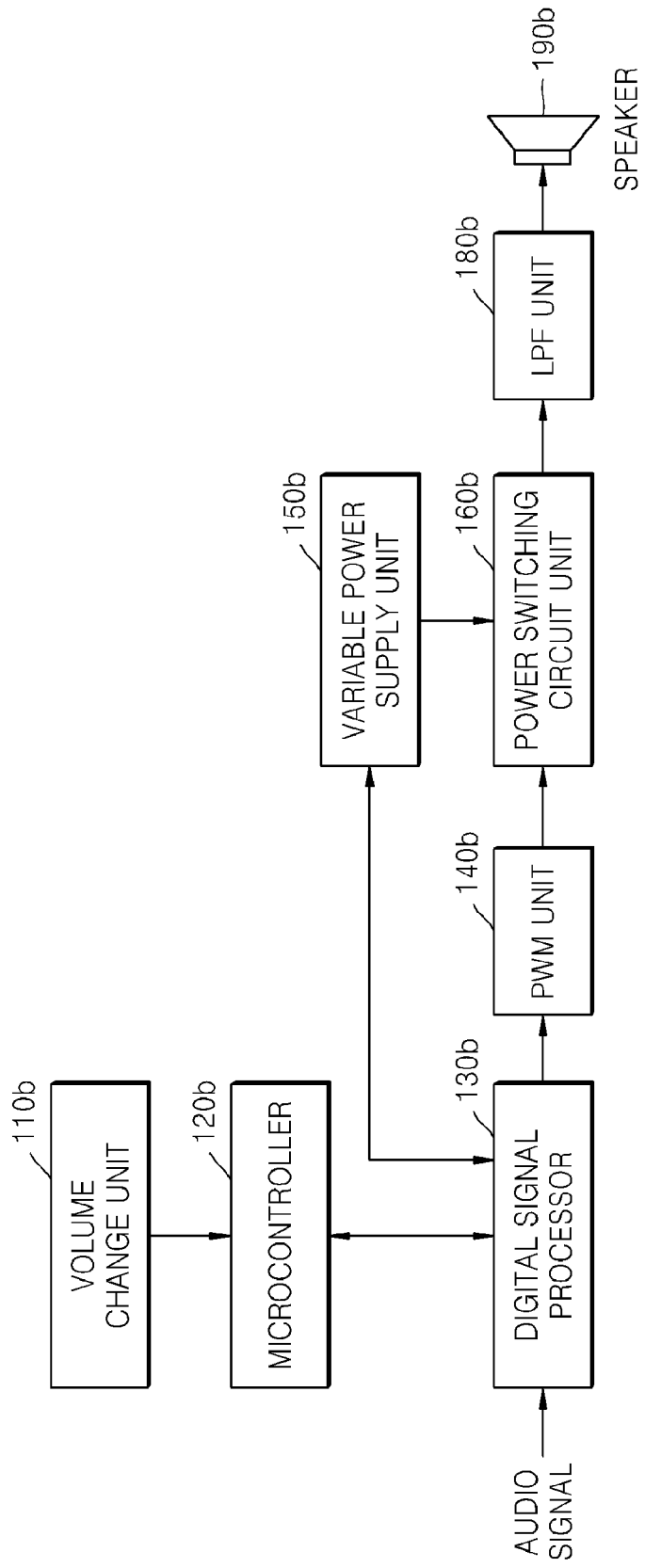
FIG. 1B is a block diagram of a open-loop type class-D audio amplifier system according to an exemplary embodiment of the present invention.

FIG. 1B is a block diagram of an open-loop type class-D audio amplifier system according to an exemplary embodiment of the present invention.

Referring to FIG. 1B, when power supply voltage level is changed, the open-loop type class-D audio amplifier system changes the amplitude of a PWM signal supplied by the PWM unit 140b while maintaining the duty of the PWM signal. In this case, an audio output of the open-loop type class-D audio amplifier system is changed according to a power supply voltage change. Thus, the open-loop type class-D audio amplifier system has to adjust a reference volume by a value corresponding to the changed power supply voltage in order to maintain the magnitude of an output signal against the power supply voltage change.

The open-loop type class-D audio amplifier system may be realized by excluding the feedback unit 170a from the closed-loop type class-D audio amplifier system illustrated in FIG. 1A.

The open-loop type class-D audio amplifier system includes a volume change unit 110b, a microcontroller 120b, a digital signal processor 130b, a PWM unit 140b, a variable power supply unit 150b, a power switching circuit unit 160b, an LPF 180b, and a speaker 190b.

The volume change unit 110b, the microcontroller 120b, the PWM unit 140b, the variable power supply unit 150b, the power switching circuit unit 160b, the LPF 180b, and the speaker 190b operate similarly to the volume change unit 110a, the microcontroller 120a, the PWM unit 140a, the variable power supply unit 150a, the power switching circuit unit 160a, the LPF 180a, and the speaker 190a illustrated in FIG. 1A, and thus descriptions thereof will be omitted here.

The digital signal processor 130b estimates an audio output level based on correlations between an input audio signal level and audio level change factors, sets the power supply voltage to the power switching circuit unit 160*b* in correspondence with the estimated audio output level, and outputs to the variable power supply unit 150*b* a power control signal corresponding to the estimated audio output level. The power control signal causes the variable power supply unit 150*b* to adjust the power supply voltage supplied to the power switching circuit unit 160*b* prior to output of the audio signal. In this case, when power supply voltage is changed in correspondence with the estimated audio output level, the digital signal processor 130*b* associates a reference volume (digital gain) with a power value. That is, the digital signal processor 130*b* changes a power supply voltage value in correspondence with the estimated audio output level and adjusts the reference volume (digital gain) by the changed power supply voltage value in order to maintain the magnitude of an output signal against a power supply voltage change.

Figure 2:
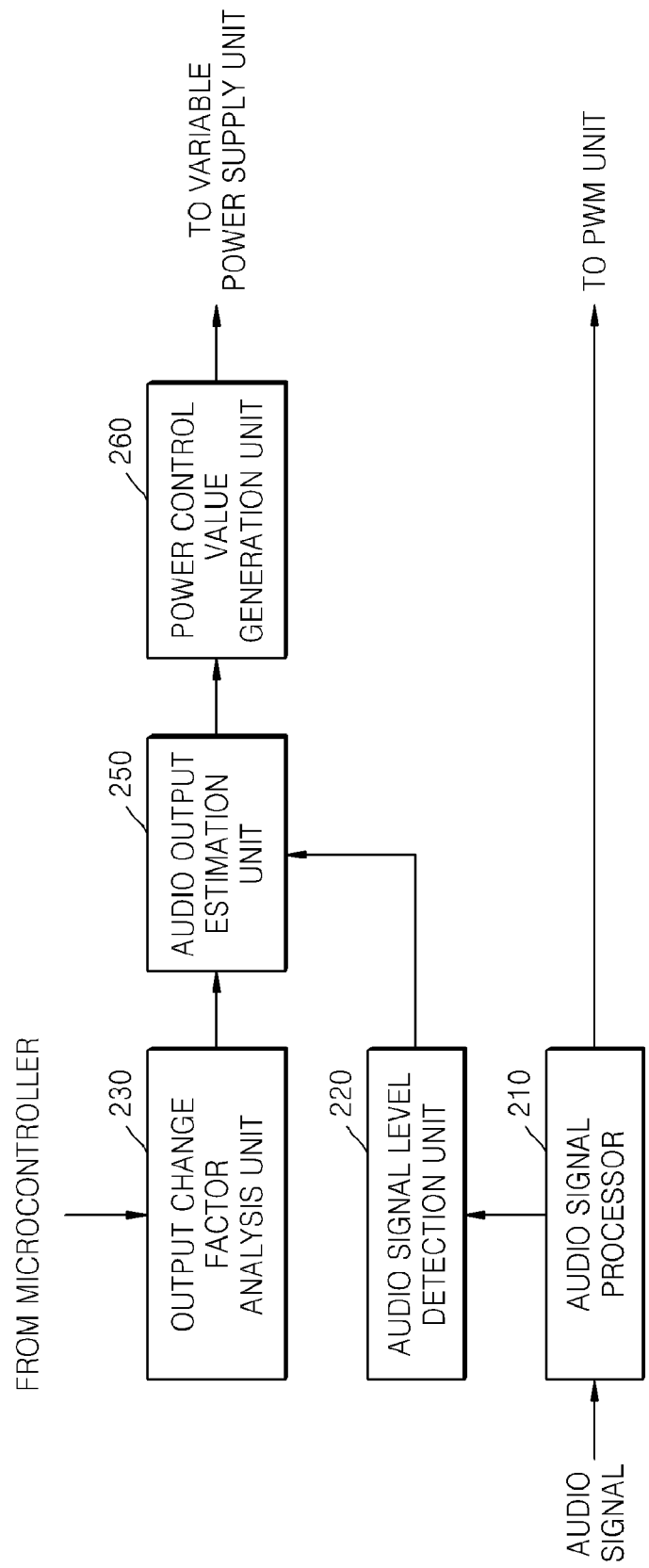
FIG. 2 is a detailed block diagram of a digital signal processor illustrated in FIG. 1A or 1B.

FIG. 2 is a detailed block diagram of the digital signal processor 130*a* or 130*b* illustrated in FIG. 1A or 1B. FIG. 2 will be described in conjunction with FIGS. 1A and 1B.

Referring to FIG. 2, the digital signal processor 130*a* or 130*b* includes an audio signal processor 210, an audio signal level detection unit 220, an output change factor analysis unit 230, an audio output estimation unit 250, and a power control value generation unit 260.

The audio signal processor 210 converts an input audio signal having a plurality of channels into PCM audio data, and performs signal processing, for example, but not limited to, equalization and enhancement on the PCM audio data.

The audio signal level detection unit 220 detects peak-to-peak values of the PCM audio data that is signal-processed by the audio signal processor 210.

The output change factor analysis unit 230 analyzes audio level change factors that affect an audio output, for example, but not limited to, volume level value and internal gain values of an audio amplifier, which are input from the microcontroller 120*a* or 120*b*.

The audio output estimation unit 250 selects the largest audio signal level from among audio signal levels detected by the audio signal level detection unit 220, and estimates an audio output level based on correlations between the selected audio signal level and the audio level change factors analyzed by the output change factor analysis unit 230. For example, the estimated audio output level is obtained by multiplying the input audio signal level by the volume level value and the internal gain values of the audio amplifier.

The power control value generation unit 260 initially sets a power control value corresponding to the audio output level, which is estimated by the audio output estimation unit 250, and outputs the power control value to the variable power supply unit 150*a* and 150*b*.

In this case, the power control value generation unit 260 generates different power control values according to an open-loop type and a closed-loop type amplifier configuration.

Figure 3:
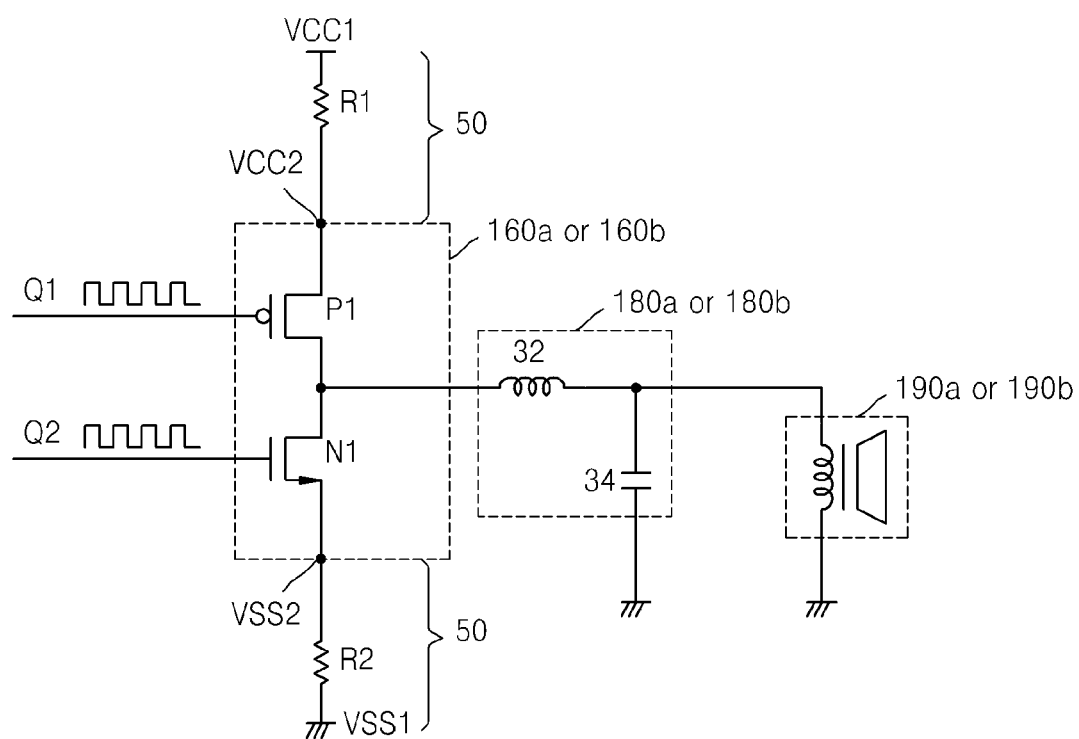
FIG. 3 is a circuit diagram of a power switching circuit unit and a low pass filter (LPF) illustrated in FIG. 1A or 1B.

FIG. 3 is a circuit diagram of the power switching circuit unit 160*a* or 160*b* and the LPF 180*a* or 180*b* illustrated in FIG. 1A or 1B.

Referring to FIG. 3, the power switching circuit unit 160*a* or 160*b* includes a p-type metal-oxide semiconductor (PMOS) transistor P1 and an n-type metal-oxide semiconductor (NMOS) transistor N1. A PWM signal is divided into first and second PWM signals Q1 and Q2, respectively, having the same phase. The PMOS transistor P1 is switched according to the first PWM signal Q1, and an actual power supply voltage VCC2 is applied to a source of the PMOS transistor P1. The NMOS transistor N1 is switched according to the second PWM signal Q2, a drain of the NMOS transistor N1 is connected to a drain of the PMOS transistor P1, and a source of the NMOS transistor N1 is connected to an actual ground voltage VSS2. In FIG. 3, VCC1 and VSS1 represent ideal voltages applied from voltage sources, and VCC2 and VSS2 are dropped by certain values due to resistances of wires 50 that connect the voltage sources to the power switching circuit unit 160*a* or 160*b*, and represent actual voltages applied to the power switching circuit unit 160*a* or 160*b*. R1 and R2 represent the resistances of the wires 50 between the voltage sources and the power switching circuit unit 160*a* or 160*b*. According to another exemplary embodiment of the present invention, the power switching circuit unit 160*a* or 160*b* may be formed with only NMOS transistors.

The LPF 180*a* or 180*b* includes an inductor 32 and a capacitor 34. The LPF 180*a* or 180*b* removes a high-frequency component of the PWM signal output from the power switching circuit unit 160*a* or 160*b*.

Figure 4:
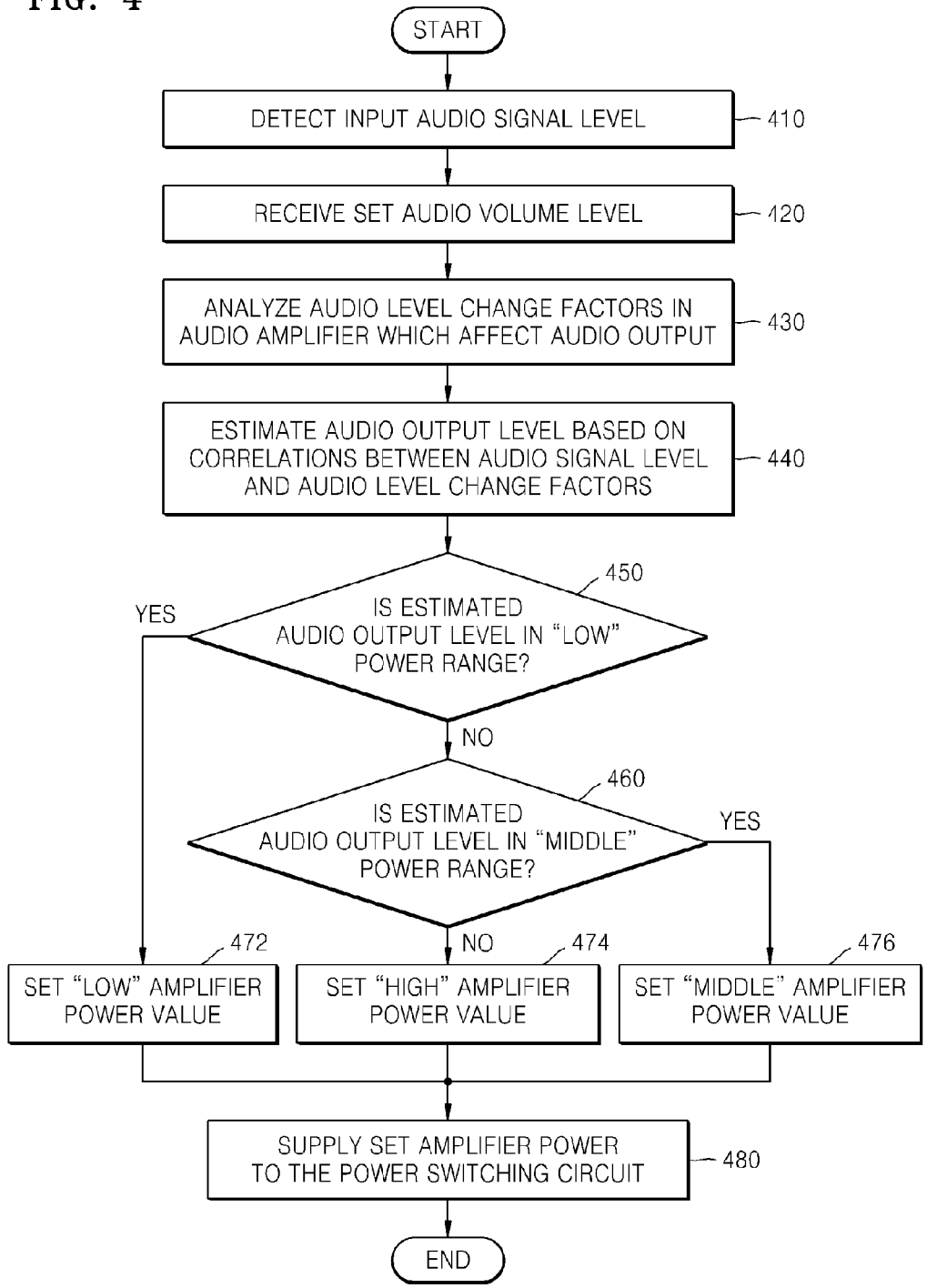
FIG. 4 is a flowchart of a method of controlling power supply voltage of a closed-loop type class-D audio amplifier, according to an exemplary embodiment of the present invention.
Figure 7A:
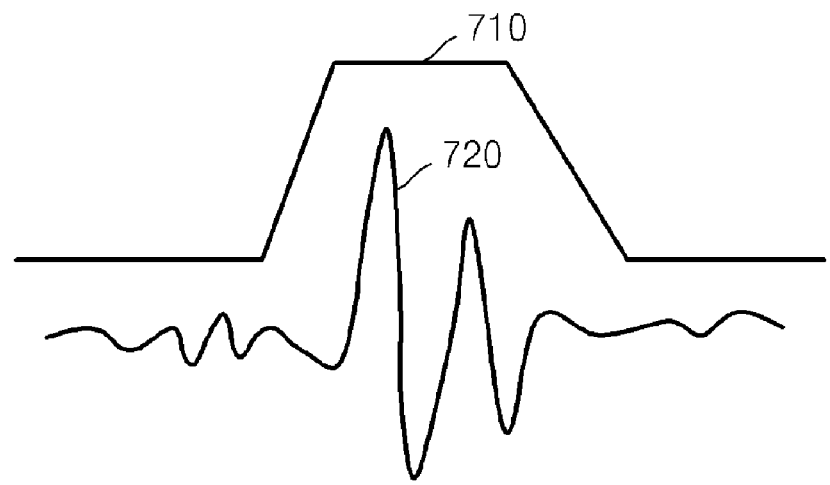
FIGS. 7A and 7B are waveforms showing correlations between an audio signal output and power supply voltage, according to exemplary embodiments of the present invention.

FIG. 4 is a flowchart of a method of controlling power supply voltage of a closed-loop type class-D audio amplifier, according to an exemplary embodiment of the present invention. FIG. 7A is a waveform showing correlations between an audio signal output and power supply voltage, according to an exemplary embodiment of the present invention.

Referring to FIG. 4, initially, audio signal levels of an audio signal input through a plurality of channels are detected (410).

An audio volume level set for example, by a user using a remote controller, is obtained (420).

Audio level change factors in the closed-loop type class-D audio amplifier which affect an audio output are analyzed (430). In this case, the audio level change factors include an audio volume level and internal gain values of the closed-loop type class-D audio amplifier.

The largest audio signal level is selected from among the audio signal levels of the channels, and an audio output level is estimated based on correlations between the selected audio signal level and the audio level change factors (440).

In this case, the estimated audio output level may be obtained using Equation 1.

$$\text{Estimated Level of Audio Output} = \text{Level of Input Audio Signal} \times \text{Volume Level Value} \times \text{Internal Gain Values of Audio Amplifier} \qquad \text{[Equation 1]}$$

Then, power supply voltage supplied to the power switching circuit unit 160*a* illustrated in FIG. 1A is initially set in correspondence with the estimated audio output level (450 through 476).

A power setting process (450 through 476) will now be described in detail.

A user divides a power range into a plurality of power ranges such as "LOW" (0.1-5V), "MIDDLE" (6-15V), and "HIGH" (16-30V) power ranges.

Initially, it is checked whether the estimated audio output level is in the "LOW" power range (450).

Then, if the estimated audio output level is in the "LOW" power range, the power supply voltage to the power switching circuit unit 160*a* is set as a "LOW" amplifier power value (472).

Otherwise, if the estimated audio output level is not in the "LOW" power range, it is checked whether the estimated audio output level is in the "MIDDLE" power range (460).

Then, if the estimated audio output level is in the "MIDDLE" power range, the power supply voltage to the power switching circuit unit 160*a* is set as a "MIDDLE" amplifier power value (operation 476).

Otherwise, if the estimated audio output level is not in the "MIDDLE" power range, the power supply voltage to the power switching circuit unit 160*a* is set as a "HIGH" amplifier power value (operation 474).

Power corresponding to the ultimately set amplifier power value is variably supplied to the power switching circuit unit 160*a* (operation 480).

According to the exemplary embodiment, a value of power supply voltage to the power switching circuit unit 160*a* is initially set by using correlations between an input audio signal level and internal gain values of an audio amplifier in the digital signal processor 130*a* or 130*b* illustrated in FIG. 1A or 1B, and the value of the power supply voltage is changed step-by-step according to the level of an output audio signal. Referring to FIG. 7A, a power supply voltage 710 follows the level of an output audio signal 720 step by step. For example, if the level of the output audio signal 720 is 0.5V, the power supply voltage 710 may be 0.7V. If the level of the output audio signal 720 is 2V, the power supply voltage 710 may be 2.3V.

Figure 5:
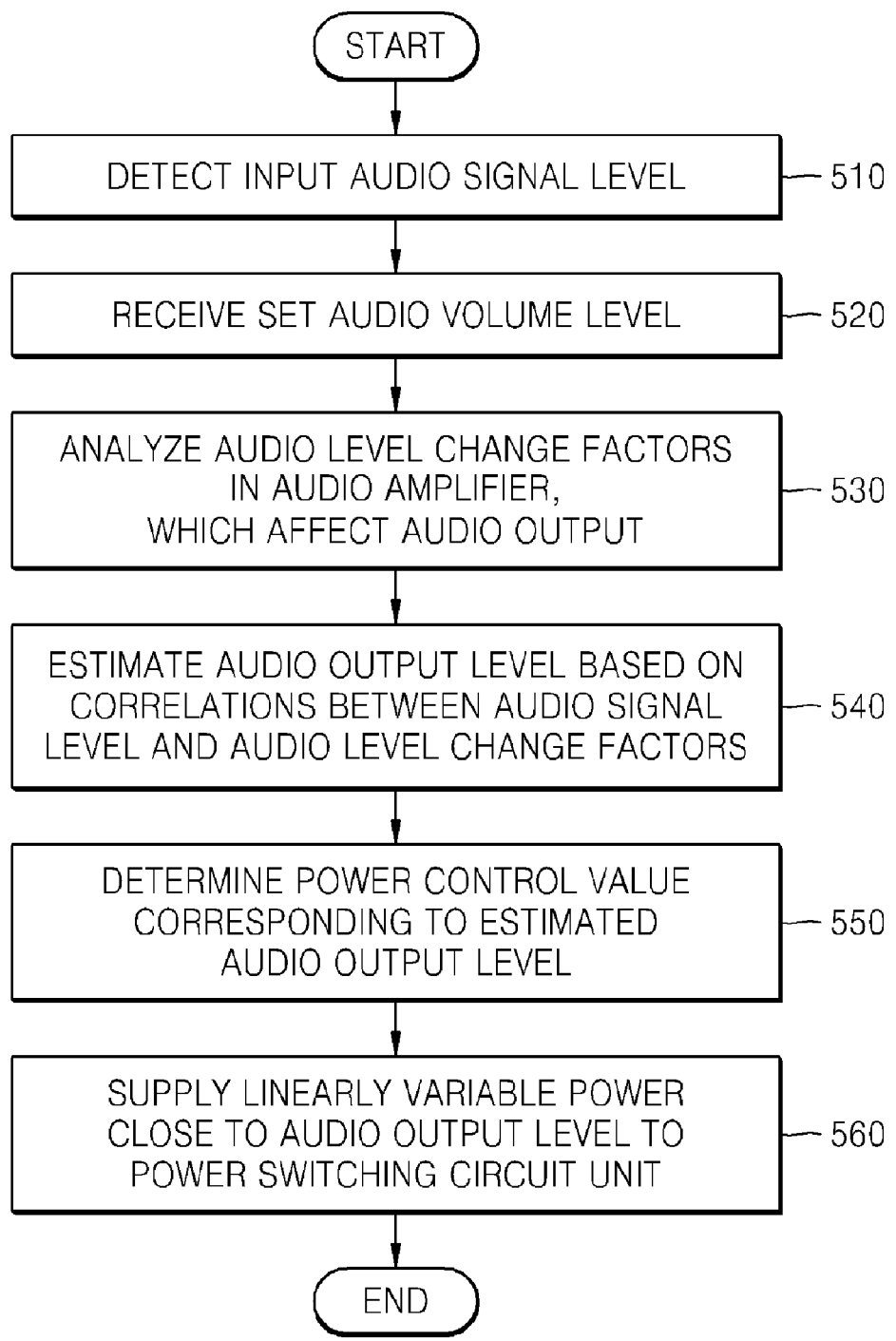
FIG. 5 is a flowchart of a method of controlling power supply voltage of a closed-loop type class-D audio amplifier, according to another exemplary embodiment of the present invention.
Figure 7B:
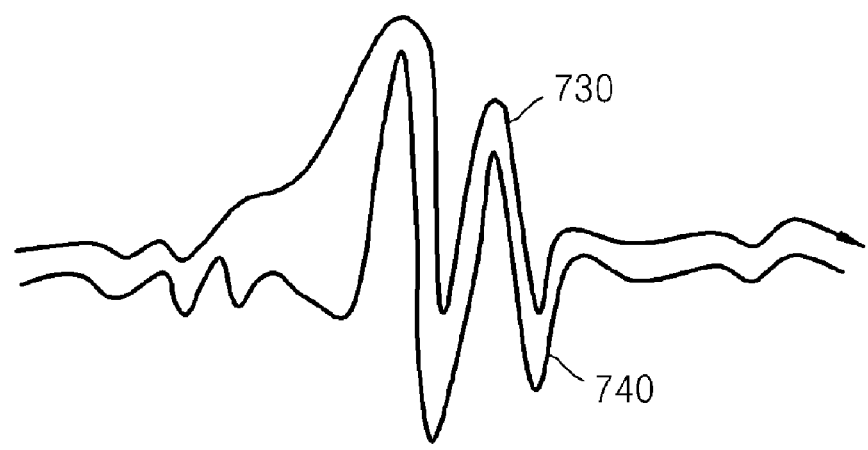

FIG. 5 is a flowchart of a method of controlling power supply voltage of a closed-loop type class-D audio amplifier, according to another exemplary embodiment of the present invention. FIG. 7B is a waveform showing correlations between an audio signal output and power supply, according to another exemplary embodiment of the present invention.

Referring to FIG. 5, initially, operations 510 through 540 are the same as operations 410 through 440 illustrated in FIG. 4 and thus descriptions thereof will be omitted here.

A power control value corresponding to an estimated audio output level is determined (550).

A linearly variable power supply voltage that is close to an audio output level is supplied to the power switching circuit unit 160*a* illustrated in FIG. 1A or 1B according to the power control value (560). For example, referring to FIG. 7A, if the level of the output audio signal 720 is 0.5V, the power supply voltage 710 may be 0.6V. If the level of the output audio signal 720 is 2V, the power supply voltage 710 may be 2.1V.

Eventually, according to the exemplary embodiment, a power supply voltage value that is linearly variable according to an audio output level estimated by a unit prior to the power switching circuit unit 160*a* is determined. Referring to FIG. 7B, a power supply voltage 730 linearly follows the level of an output audio signal 740. For example, power supply voltage values corresponding to peak values of output audio signal levels are generated.

Figure 6:
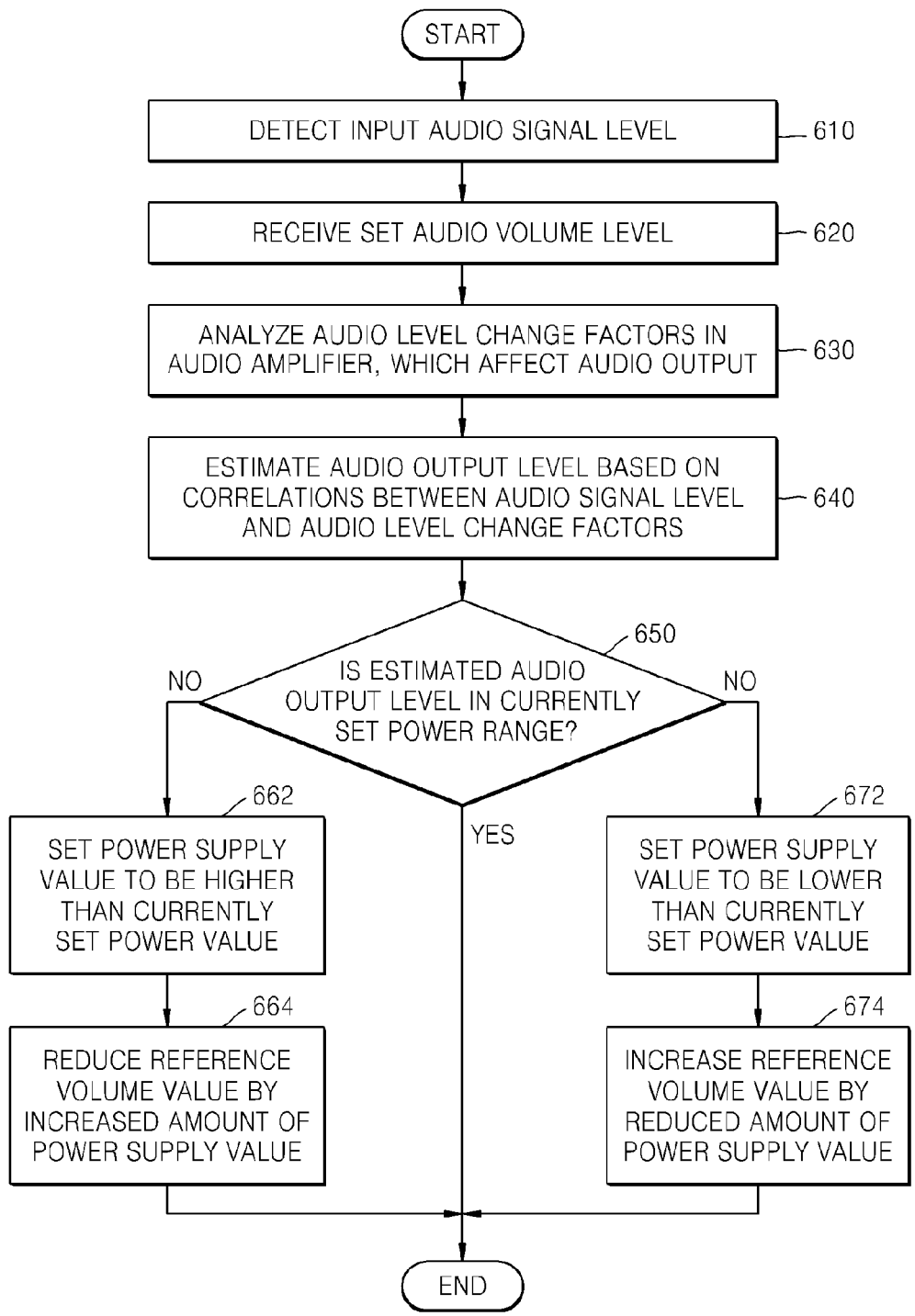
FIG. 6 is a flowchart of a method of controlling power supply voltage of an open-loop type class-D audio amplifier, according to an exemplary embodiment of the present invention.

FIG. 6 is a flowchart of a method of controlling power supply voltage of an open-loop type class-D audio amplifier, according to an exemplary embodiment of the present invention.

Referring to FIG. 6, initially, operations 610 through 640 are the same as operations 410 through 440 illustrated in FIG. 4 and thus descriptions thereof will be omitted here.

It is checked whether an estimated audio output level is in a currently set power range (650). In this case, if the estimated audio output level is in the currently set power range, power supply voltage corresponding to a currently set power value is supplied to the power switching circuit unit 160*b* illustrated in FIG. 1B.

Otherwise, if the estimated audio output level is higher than the currently set power range, a power supply voltage is set to be higher than the currently set power value (662). In this case, if the power supply voltage is increased, an ultimate output signal level is changed and thus a reference volume value is reduced by an amount corresponding to an increased amount of the power supply voltage (664). For example, if a maximum power supply voltage is 30V, a currently set power supply voltage is 20V, and the estimated audio output level is 28V, the power supply voltage is set to be 30V and an audio volume value is reduced by 10V, which corresponds to the amount the power supply voltage was increased.

Otherwise, if the estimated audio output level is lower than the currently set power range, the power supply voltage is reduced to be lower than the currently set power value (672). In this case, if the power supply voltage is reduced, the ultimate output signal level is changed and thus the reference volume value is increased by the reduced amount of the power supply voltage (674). For example, if a maximum power supply voltage is 30V, a currently set power supply voltage is 20V, and the estimated audio output level is 7V, the power supply voltage is set to be 10V and an audio volume value is increased by 10V, which corresponds to the amount the power supply voltage was reduced.

Ultimately, the open-loop type class-D audio amplifier may maintain the magnitude of an output signal against a power supply voltage change by associating a reference volume value with a power value that is changed according to an estimated audio output level.

Figure 8A:
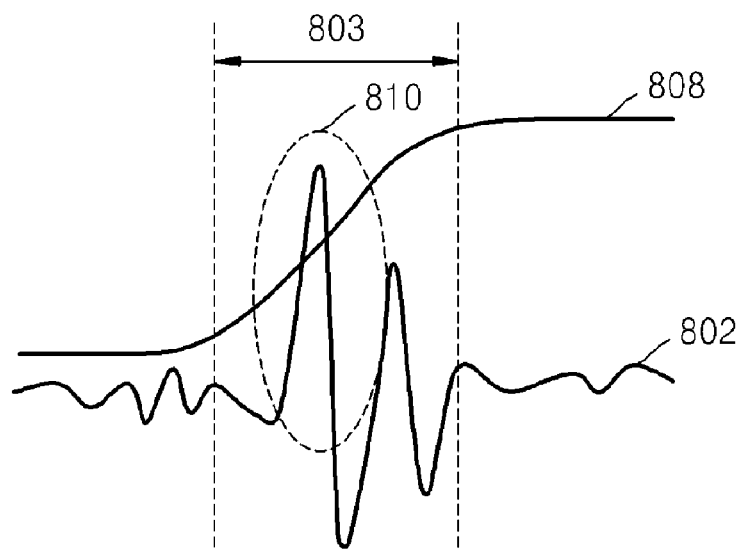
FIGS. 8A and 8B illustrate waveforms of a power control signal that follows an audio output in order to prevent audio output distortion in the digital signal processor illustrated in FIG. 1A or 1B, according to an exemplary embodiment of the present invention.
Figure 8B:
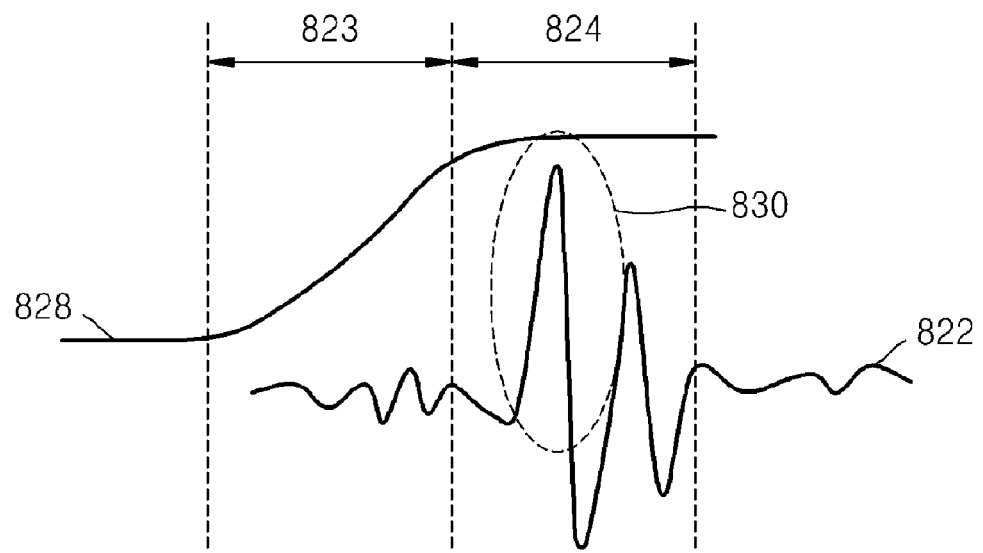

FIGS. 8A and 8B illustrate waveforms of a power control signal that follows an audio output in order to prevent audio output distortion in the digital signal processor 130*a* or 130*b* illustrated in FIG. 1A or 1B, according to an exemplary embodiment of the present invention.

Referring to FIG. 8A, if a power supply voltage 808 follows an output audio signal 802, sound quality distortion occurs when the output audio signal 802 is clipped by the power supply voltage 808 in a power increasing region 803 (see dashed circle 810).

Thus, the digital signal processor 130*a* or 130*b* may adjust a tracking time of the power control signal with respect to the audio output level by using a buffer. In more detail, as illustrated in FIG. 8B, sound quality distortion may be prevented by increasing a power supply voltage 828 prior to an output audio signal 822 in a digital domain by using a buffering time (see a region 823) and then maintaining the power supply voltage 828 (see a region 824).

Figure 9A:
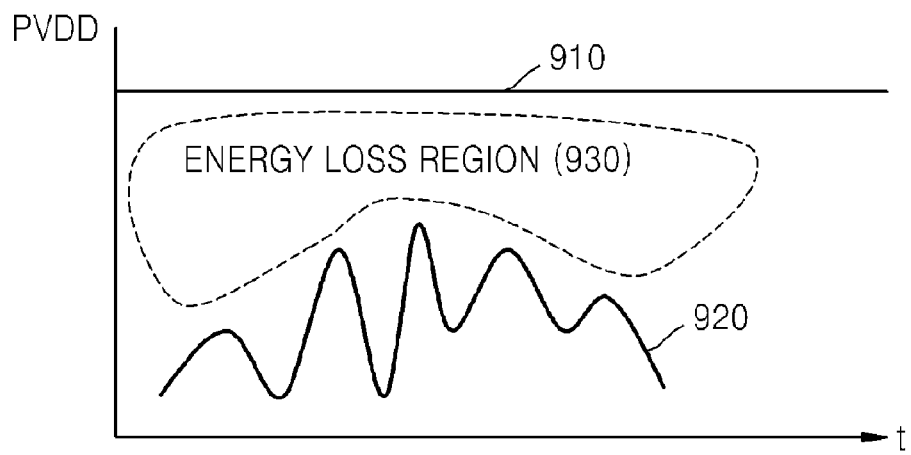
FIGS. 9A and 9B are graphs showing power control comparison between an audio amplifier according to an exemplary embodiment of the present invention and a related art audio amplifier.
Figure 9B:
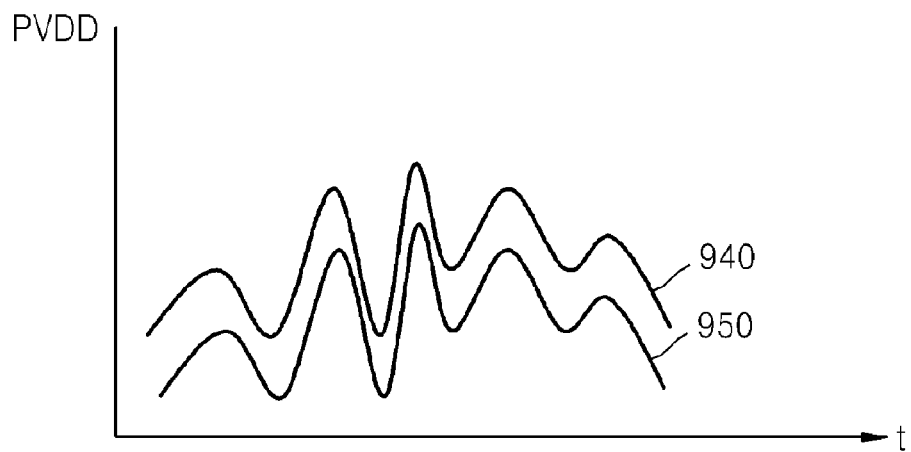

FIGS. 9A and 9B are graphs showing power control comparison between an audio amplifier according to exemplary embodiments of the present invention and a related art audio amplifier.

Referring to FIG. 9A, in the audio amplifier according to the related art, the level of a power supply voltage 910 is uniformly maintained at a preset value regardless of an input audio signal level and thus a relatively large amount of power is unnecessarily wasted in comparison to the level of an output audio signal 920 that is actually amplified through the audio amplifier. In FIG. 9A, an energy loss region 930 between the level of the power supply voltage 910 and the level of the output audio signal 920 is indicated by a dashed line.

On the other hand, referring to FIG. 9B, in the audio amplifier according to exemplary embodiments of the present invention, the digital signal processor 130*a* or 130*b* illustrated in FIG. 1A or 1B initially estimates an audio output and changes power supply voltage to the power switching circuit unit 160*a* or 160*b* illustrated in FIG. 1A or 1B, by using correlations between an input audio signal level and internal gain values of the audio amplifier. Thus, as illustrated in FIG. 9B, the level of a power supply 940 may be changed by dynamically changing the level of an output audio signal 950. Accordingly, the audio amplifier according to exemplary embodiments of the present invention may reduce power supply voltage to the power switching circuit unit 160 when audio reproduction is performed at a low output, while maintaining a maximum audio output, thereby improving the efficiency of audio amplification. Also, the audio amplifier according to exemplary embodiments of the present invention may reduce consumption of power and heat so as to reduce noise and the size of a heat sink.

The present invention can also be embodied as computer readable code on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of controlling power supply voltage of an audio amplifier, the method comprising:
    estimating, with a digital signal processor, an audio output level of an input audio signal based on correlations between an input audio signal level and audio level change factors;
    setting a value of power supply voltage supplied to a power switching circuit unit in correspondence with the estimated audio output level;
    variably controlling the power supply voltage supplied to the power switching circuit unit according to the set value of power supply voltage; and
    associating audio volume with the power supply voltage which is changed in accordance with the estimated audio output level to maintain a magnitude of an audio output signal with respect to a change in the power supply voltage.

2. The method of claim 1, wherein the audio level change factors comprise an audio volume level set by a user and internal gain values of the audio amplifier.

3. The method of claim 2, wherein the internal gain values of the audio amplifier comprise gain values of a digital signal processor and a pulse width modulation unit.

4. The method of claim 1, wherein the estimated audio output level is obtained by multiplying the input audio signal level by the set audio volume level and the internal gain values of the audio amplifier.

5. The method of claim 1, wherein the input audio signal level is the largest audio signal level from among audio signal levels detected from a plurality of channels.

6. The method of claim 1, wherein the value of the power supply voltage supplied to the power switching circuit unit is set step-by-step in correspondence with the estimated audio output level.

7. The method of claim 1, wherein the value of the power supply voltage supplied to the power switching circuit unit is linearly set in correspondence with the estimated audio output level.

8. The method of claim 1, further comprising adjusting a tracking time of the power control signal with respect to the estimated audio output level.

9. The method of claim 1, wherein the associating a reference volume value with the value of the power comprises:
    setting the value of the power supply voltage to be higher than a currently set power value and reducing the reference volume value by an amount corresponding to the increased value of the power supply voltage if the estimated audio output level is higher than a currently set power range; and
    setting the value of the power supply voltage to be lower than the currently set power value and increasing the reference volume value by a reduced an amount corresponding to the reduced value of the power supply voltage if the estimated audio output level is in the currently set power range.

10. A non-transitory computer readable recording medium having recorded thereon a computer program including computer executable instructions for causing a computer to execute the method of claim 1.

11. An apparatus for controlling power supply of an audio amplifier, the apparatus comprising:
    a digital signal processor which estimates an audio output level of an input audio signal based on correlations between an input audio signal level and an analyzed audio level change factors, and sets a power control value corresponding to the estimated audio output level;
    a variable power supply unit which supplies a power supply voltage that is changed according to the power control value corresponding to the estimated output level set by the digital signal processor; and
    a power switching circuit unit which amplifies a pulse width modulation signal according to the variable power supply voltage supplied by the variable power supply unit,
    wherein audio volume is associated with the power supply voltage that is changed according to the power control value corresponding to the estimated output level to control a change of the audio output level with respect to a change in the power supply voltage.

12. The apparatus of claim 11, wherein the digital signal processor comprises:
    a signal level detection unit which detects audio signal levels of a plurality of channels;
    an output change factor analysis unit which analyzes the audio level change factors regarding an audio output by using a volume level value and gain values of the audio amplifier;
    an audio output estimation unit which estimates an audio output level based on correlations between the audio signal level detected by the signal level detection unit and the audio level change factors analyzed by the output change factor analysis unit; and
    a power control value generation unit which sets a power control value corresponding to the audio output level estimated by the audio output estimation unit.

13. The apparatus of claim 11, wherein the digital signal processor adjusts a tracking time of a power control signal with respect to the audio output level.

14. The apparatus of claim 11, further comprising a microcontroller which provides a user audio volume level and the audio level change factors corresponding to gains of the audio amplifier, to the digital signal processor.

15. The apparatus of claim 11, wherein the power control value generation unit generates different power control values according to an open-loop type audio amplifier system and a closed-loop type audio amplifier system.

* * * * *